(12) United States Patent
Kravtsounov et al.

(10) Patent No.: US 7,348,899 B2
(45) Date of Patent: Mar. 25, 2008

(54) METHODS, APPARATUS, AND SYSTEMS FOR ORDER-ADAPTIVE COMPRESSION

(75) Inventors: Evgeny Kravtsounov, Moscow (RU); Ilya Brailovskiy, Moscow (RU)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/463,060

(22) Filed: Aug. 8, 2006

(65) Prior Publication Data

US 2006/0290538 A1    Dec. 28, 2006

Related U.S. Application Data

(63) Continuation of application No. PCT/RU2005/000307, filed on Jun. 3, 2005.

(51) Int. Cl.
*H03M 7/00*    (2006.01)
(52) U.S. Cl. .......................... 341/51; 341/50
(58) Field of Classification Search ............. 341/50–75
See application file for complete search history.

(56) References Cited

U.S. PATENT DOCUMENTS 6,788,227 B2 *   9/2004  Hall et al. .................... 341/51
2003/0184453 A1 * 10/2003  Hall et al. .................... 341/51

OTHER PUBLICATIONS

Brailovsky, I.V; et al, "A New Low Complexity Entropy Coding Method" Graphicon 2004, Moscow State University, Sep. 6, 2004, Technical 1-2.*
Brailowsky, I. V., et al., "A New Low-Complexity Entropy Coding Method", *Graphicon 2004, Moscow State University*, URL:http://www.graphicon.ru/2004/Proceedings/Technical/s4 3!.pdf>,(Sep. 6, 2004), 1-2.

* cited by examiner

*Primary Examiner*—Lam T. Mai
(74) *Attorney, Agent, or Firm*—Schwegman, Lundberg & Woessner, P.A.

(57) ABSTRACT

Methods, apparatus, and systems are provided for order-adaptive compression. A sting is iterated to produce a compression sequence relative to an alphabet having symbols associated with the string. During the iteration, the order of the alphabet is altered in response to a given frequency condition.

15 Claims, 3 Drawing Sheets

METHODS, APPARATUS, AND SYSTEMS FOR ORDER-ADAPTIVE COMPRESSION

This application is a continuation under 35 U.S.C. 111(a) of International Application No. PCT/RU2005/000307, filed on 3 Jun. 2005, and published in English on 14 Dec. 2006 as WO 2006/132559, which is incorporated herein by reference.

TECHNICAL FIELD

Techniques are presented for digital communications and more particularly for digital communications related to data compression and to data decompression.

BACKGROUND INFORMATION

The coding technique of Generalized Interval Transformations (GIT's) is based on generalizations of inversion frequency algorithms. GIT's operate on blocks of data and convert data to sequences of geometrically distributed integer numbers. These integer numbers may be further compressed to produce smaller bit streams.

A GIT may be a partial or a full GIT. In a partial GIT, symbols of a string are represented in an alphabet. The alphabet is split to produce non-empty sub-alphabets, where the symbol set of one sub-alphabet is unique and does not overlap with symbol sets of the other remaining sub-alphabets. From the original string and the alphabets, integer number sequences are produced for each sub-alphabet relative to the original string being compressed. Finally, a last sequence is produced that combines or ties the other sequences into a single sequence.

A full GIT uses different splits and different algorithms to further compress sequences that may be generated from a partial GIT. Iterations of a full GIT may reduce a final integer number sequence for the string being compressed into a sequence of numbers with respect to a single symbol included within the original string.

GIT's rely on a natural order of the alphabets from which they depend. Thus, GIT compression does not alter alphabetic orders.

DESCRIPTION OF EMBODIMENTS

Figure 1:
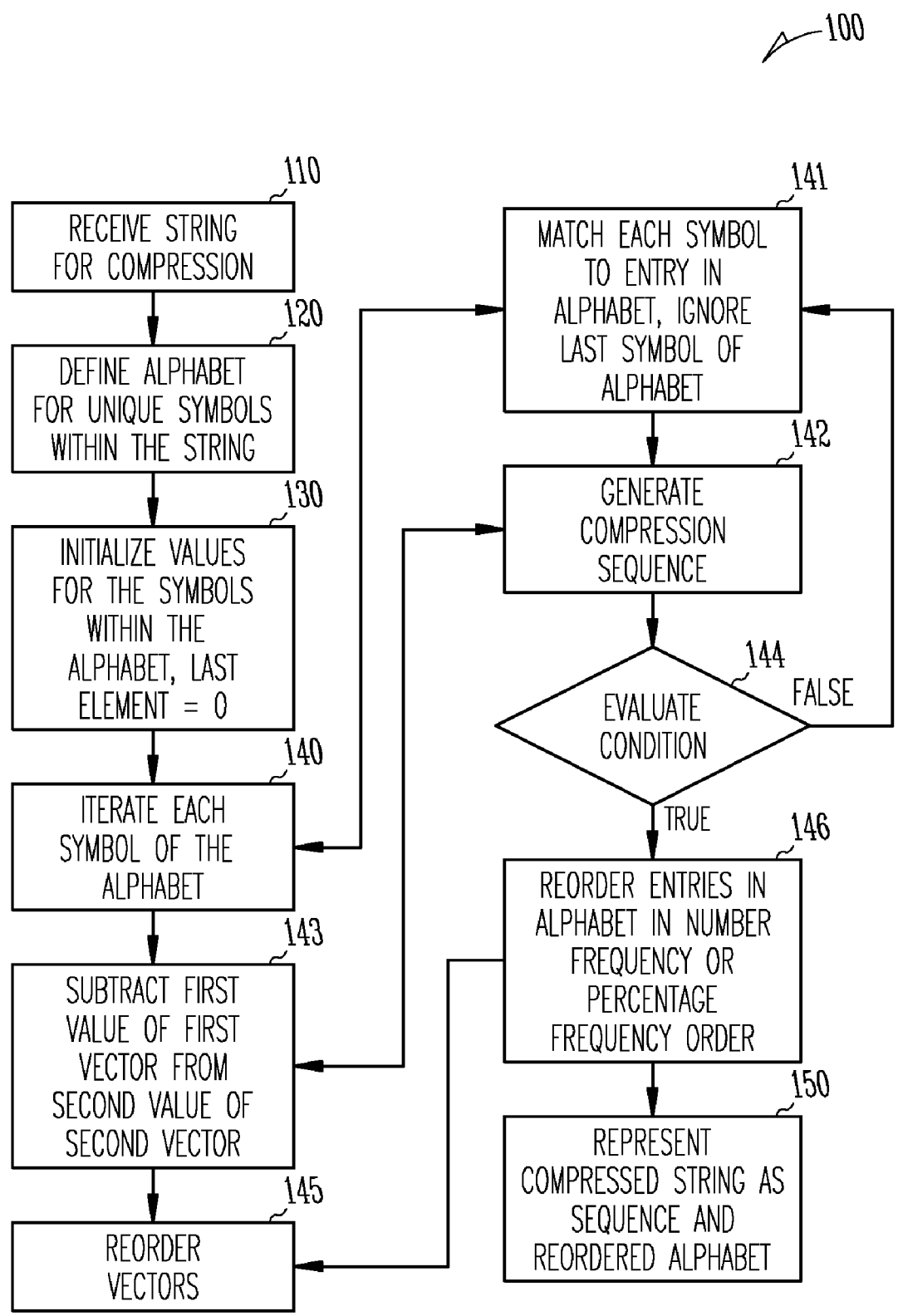
FIG. 1 is diagram of a method for order-adaptive compression, according to an example embodiment.

FIG. 1 is diagram of a method 100 for order-adaptive compression, according to an example embodiment. The method 100 (hereinafter "order-adaptive compression service") is implemented in a machine-accessible or readable medium and is optionally accessible as electromagnetic signals or via a network adapter over a network. The order-adaptive compression service when processed within a machine produces a modified Generalized Interval Transform (GIT) compression for a given string having a reordered alphabet associated with the compressed string.

Initially, at 110, a string is received for compression. The string includes a variety of repeating symbols (e.g., a, b . . . z, punctuation, and other machine-readable characters). Each unique symbol is associated with an element of an alphabet for the compression. Thus, each element of the alphabet includes a unique one of the symbols that may or may not repeat within the string. In this manner, at 120, an alphabet for the string is defined.

Next, at 130, the elements of the alphabet are initialized as integer values within a vector or array associated with the alphabet. For example, assuming the total number of unique symbols is 256, each element of the alphabet array corresponds to one of the symbols. In an embodiment, the alphabet array A is of length 256, the first element is referenced by A[i], where i begins at 0 and continues to 255. Each element of the A is initially assigned a value of A[i]=i+1; the last element A[255] is assigned a value of 0.

At this point a GIT algorithm may be used to produce a compression sequence for the string. The compression sequence ignores the last symbol of the alphabet or element A[255] in the present example. The compression sequence uses integer number sequences to represent the string in a compressed format. For example consider a string S=abaab, here the compression sequence I=0,1,0. That is, the first "a" occurs in the first position (position 0) of I, so it has a 0 offset value, the second occurrence of "a" occurs 1 position after the first "a" and the third and final occurrence of "a" occurs in the first position after the second occurrence of "a." Moreover, because the original length of S is carried as metadata with the compressed sequence or carried as a header file, the length of S is known to be 5; from this information the last symbol of the alphabet A=[a,b], which is "b," can be properly populated in a decompressed version of S from I as S=abaab. The compressed sequence represents offset values for a given symbol within the string being compressed with respect to subsequent occurring instances of that given symbol.

The GIT algorithm also uses two additional vectors or arrays, the first vector F[ ] includes an integer number in its entries for a given symbol, that number represents the number of symbols that occur before a given symbol referenced by a specific entry of F[ ]. For example, in the prior example for S=abaab; F[0]=0 because "a" has zero symbols that occur before it appears in S. F[ ] is of the same length as the alphabet A. The second vector is F_prev [ ] and corresponds to a previous symbol that occurred within S for a given symbol. For example, if S=baca, then F[0]=1 and F_prev [0]=−1 because there is no prior occurrence of "a" before S[1], where S is referenced from 0 to 3 and is of length 4.

One GIT algorithm for producing a compressed sequence for a given string may be implemented as follows:

(1) k=0, and is a integer number index into a string S; F[i]=0 and F_prev[i]=−i for all i in [0. . . , IAI−1], where i is an index value into alphabet A, F[ ], and F_prev[ ], and the notation IAI refers to the length of alphabet A, both F[ ] and F_prev[ ] are the same length as A.

(2) Find i in A, such that S[k]=A[i].

(3) Calculate F[i]−F_prev[i] and add number result to compression sequence I as $I_j$; if i not equal to IAI.

(4) F_prev[i]=F[i].

(5) For all j<i; F[j]=F[j]+1, where j is an integer number and an index into F[ ].

(6) k=k+1.

(7) If k not last entry in S, then begin again at (2).

The example GIT algorithm when processed can produce the compression sequence I=0,1,0 for S=abaab. Again, the last symbol "b" does not have to be represented in the compression sequence because the length of S is known and I helps recreate S for positions of "a;" the positions and numbers of "b's" can be calculated when S is decompressed from I.

At 140, each symbol within a given string S is iterated using a modified GIT algorithm to produce a compression sequence I. This is done, by, at 141, matching entries in S against corresponding elements in the alphabet A, where the last symbol and the last element of A are ignored.

During a single iteration, at 142, a compression sequence element is generated. Next, at 143, a first value housed in the first vector F[ ] is subtracted from F_prev[ ], in manners similar to what was presented by way of example above. However, the example GIT algorithm presented above is modified in a number of manners, such that a frequency condition, at 144, is evaluated with each generated compression sequence element of I. Moreover, as was mentioned above the values of A are defined such that A[i]=i+1 for all i in [0,255], and A[255]=0, where IAI=256.

If the frequency condition, at 144, evaluates to false, then processing continues in the manner discussed above with the sample GIT algorithm.

However, if the frequency condition, at 144, evaluates to true, then the elements of the alphabet A are reordered to be adaptive to the condition as it appears within the sequence of symbols occurring within S. This reordering means that, at 145, F[ ] and F-prev[ ] have to be adjusted to also account for the reordering of A. Accordingly, the reordering occurs to the alphabet, at 146.

The frequency condition can be any condition that compares pairs of symbols occurring within S against ordered entries for these symbols within A. The comparisons may look for raw frequency numbers for a given symbol within S, percentage of frequencies for a given symbol within S, frequencies of a given symbol relative to a grouping of other symbols within S, and the like. If a condition is met, than values for pairs being compared swap positions within A.

For example, the above-presented GIT algorithm may be modified as follows:

(1) k=0, initialize F[i]=0, F_prev[i]=−1 for all i in [0, . . . , IAI−1 ].
(2) A[i]=i+1 for all i in [0,254], where A[255]=0.
(3) Find i such that S[k]=A[i].
(4) Calculate F[i]−F_prev[i] and add to sequence $I_i$, if i does not equal 255 of IAI.
(5) F_prev[i]=F[i].
(6) For all j<i; F[j]=F[j]+1.
(7) For pairs j1,j2 equal to (i−1, i) or (i, i+1) do If (Cond_X(S,k,A[j1],A[j2]) then swap (A[j1],A[j2]) and recalculate (F[j1],F[j2],F_prev[j1],F_prev[j2]).
(8) k=k+1.
(9) If k is not last entry in S, then go to (3).

In the modified GIT, the function swap trades values of variables. The function recalculate is any function that recalculates values for F[j1], F[j2], F_prev[j1], and F_prev[j2] in a way that inverse transformation is achievable.

The order-adaptive compression service modifies a GIT algorithm for purposes of testing a desired frequency condition. The frequency condition corresponds to frequency of symbols or groups of symbols occurring within a string being compressed. If the condition evaluates to true, then the natural order of the alphabet is altered or changed. At 150, the new order-adaptive alphabet is associated with the compression sequence and represents a compressed version of the original string.

Figure 2:
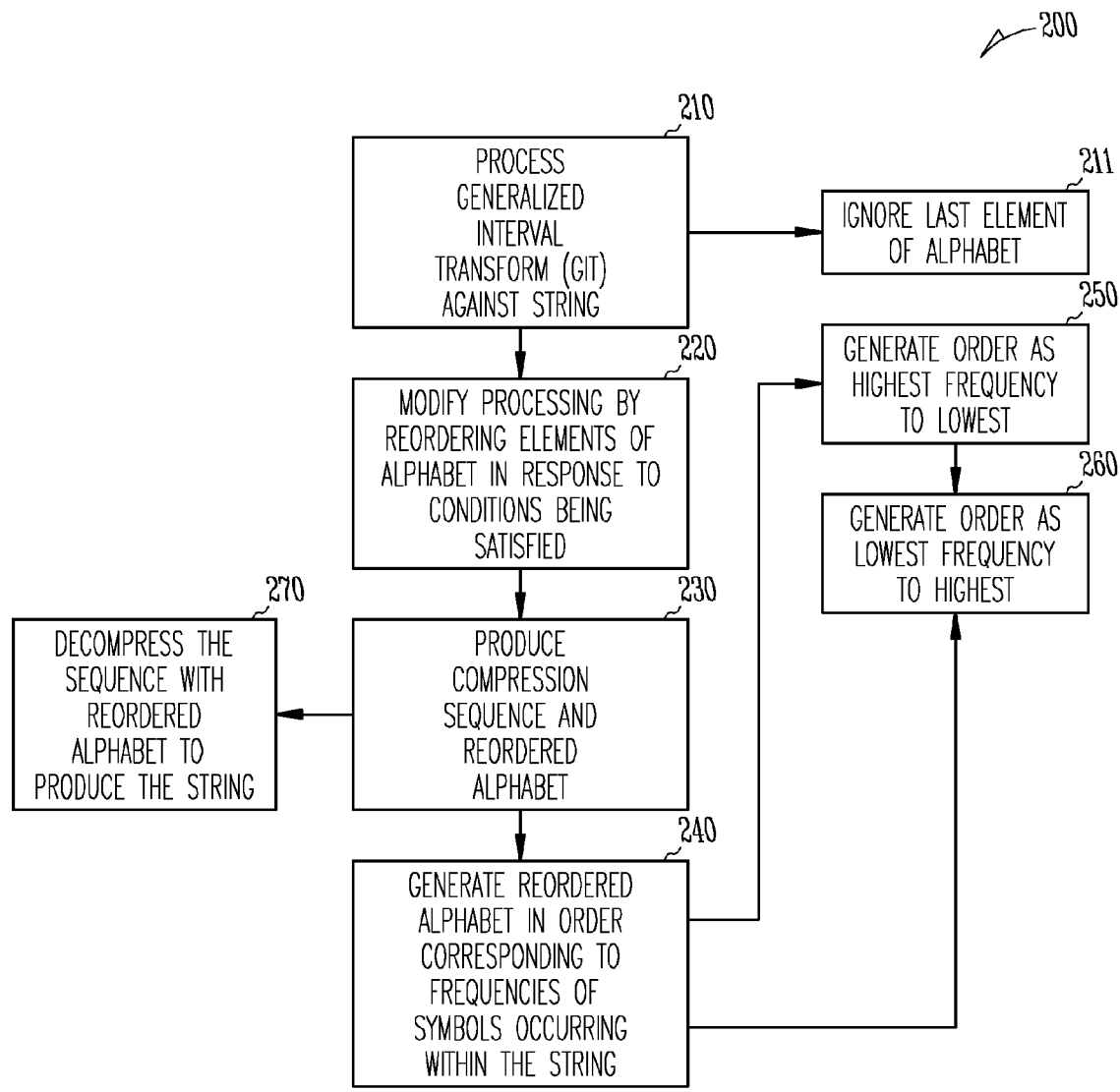
FIG. 2 is a diagram of another method for order-adaptive compression, according to an example embodiment.

FIG. 2 is a diagram of another method 200 for order-adaptive compression, according to an example embodiment. The method 200 is implemented as machine-accessible or readable instructions. The instructions reside in a machine medium and when processed by a machine perform the processing depicted in FIG. 2 for purposes of providing an order-adaptive compression on a string.

The instructions may reside on removable media, which when interfaced and uploaded to a machine perform the processing depicted in FIG. 2. Alternatively, the instructions may be prefabricated within memory or storage of a machine as electromagnetic signals. The instructions may also be downloaded over a network from one machine and loaded to another machine where they are subsequently processed. In still further cases, the instructions may be remotely processed over a network on one machine at the direction of another machine interfaced to the network. The communication of the network may be wired, wireless, or a combination of wired and wireless.

When a machine processes the instructions, at 210, a GIT algorithm is processed on a given or desired string for purposes of generating or producing a compression sequence for symbols occurring within the alphabet. At 211, the last symbol of the alphabet associated with unique symbols appearing within the string is ignored. Initially, the alphabet is ordered, such that the last element or symbol has a value of zero and is ignored or not processed by the GIT algorithm.

At 220, the elements of the alphabet are reordered if a defined frequency condition is met during iterations of the GIT algorithm. The GIT algorithm is modified in response to satisfying a desired and predefined frequency condition. A technique for producing this order-adaptive alphabet with the compression sequence was presented above with respect to the method 100 of FIG. 1.

Accordingly, at 230, a compression sequence having a reordered alphabet is produced. At 240, the reordered alphabet comports with the desired frequency condition that is satisfied by the frequency of symbols occurring within the string being compressed. In other words, the order of the alphabet is adaptive to the way and manner in which symbols are appearing and recurring within the string based on the desired frequency condition.

In an embodiment, at 250, the order of the alphabet may organize elements of the alphabet in an order where elements that correspond to symbols are ordered from a highest frequency to a lowest frequency as they appear within the string being compressed.

In still another embodiment, at 260, the order of the alphabet may organize elements of the alphabet in an order where elements that correspond to symbols are ordered from a lowest frequency to a highest frequency as they appear within the string being compressed.

In yet other embodiments, the order of the alphabet may be determined based on the desired frequency condition and the sequence of symbols appearing within the string being compressed.

According to an embodiment, at 270, the compression sequence and the reordered alphabet may be subsequently processed to reproduce the original string. That is, the compression sequence combined with the order-adaptive alphabet is used to reproduce the original string in its entirety.

It is now appreciated how a defined frequency condition may be used to drive a modified GIT in order to produce an order for a given string being compressed that is adaptive to the condition based on how symbols appear within the string. This can further enhance the compression of the string and is more efficient when decompression the string from the compression sequence.

Figure 3:
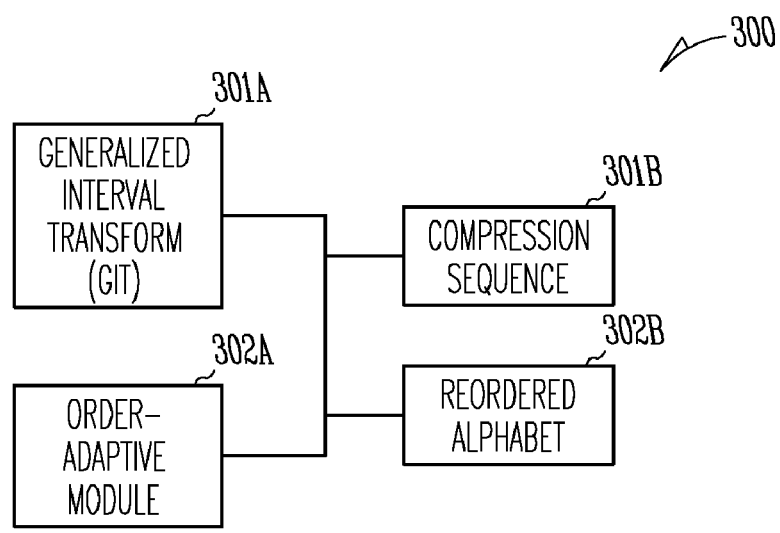
FIG. 3 is a diagram of an order-adaptive compression apparatus, according to an example embodiment.

FIG. 3 is a diagram of an order-adaptive compression apparatus 300, according to an example embodiment. The order-adaptive compression apparatus 300 is implemented in a machine-accessible or readable medium and is optionally accessible over a network. In an embodiment, the order-adaptive compression apparatus 300 implements, among other things, the methods 100 and 200 of FIGS. 1 and 2, respectively.

The order-adaptive compression apparatus 300 includes a GIT module 301A and an order-adaptive module 302A. The order-adaptive compression apparatus 300 processes a given string for purposes of compressing that string and generates a compression sequence 301B and a reordered or an order-adaptive alphabet 302B. The alphabet 302B is in an adaptive order because it enforces a frequency condition with respect to how symbols appear within the given string being compressed.

The GIT module 301A generates an alphabet for a given string being compressed. To do this, the GIT module 301A processes against the string in manners discussed herein and above and generates a compression sequence 301B. The compression sequence 301B includes numbers that represent positional locations for given symbols within the string, each number within the compression sequence 301B is an offset relative to a previous number occurring within the compression sequence 301B.

The order-adaptive module 302A modifies the processing of the GIT module 301A. To do this, the alphabet is ordered such that the last element corresponding to the last naturally ordered symbol of the alphabet is assigned a value of zero. Next, after each compression sequence element is produced by the GIT module 301A, a desired and predefined frequency condition is evaluated against the present state of the compression sequence 301B in view of the latest updated entry to the compression sequence 301B.

The frequency condition may check for frequency of symbols relative to surrounding symbols being represented within the compression sequence 301B; check for frequencies of symbols on a raw number basis, check for frequencies on a percentage basis, and/or check for frequencies of a particular symbol relative to configurable groupings of other symbols. One technique for evaluating pairs of entries as they are updated to the compression sequence 301B was provided above with respect to the method 100 of FIG. 1.

If a frequency condition is met, then the order-adaptive module 302A modifies the alphabet to produce a reordered alphabet 302B. The reordered alphabet 302B is adapted to the frequency condition based on how symbols are appearing within the string, which is being dynamically and in real time compressed.

The order-adaptive module 302A processes in stream with the GIT module 301A as the string is being processed and the compression sequence 301B is being generated or produced. A single pass against the string is used. That is, the reordered alphabet 302B is produced by a single processing pass against the string.

Figure 4:
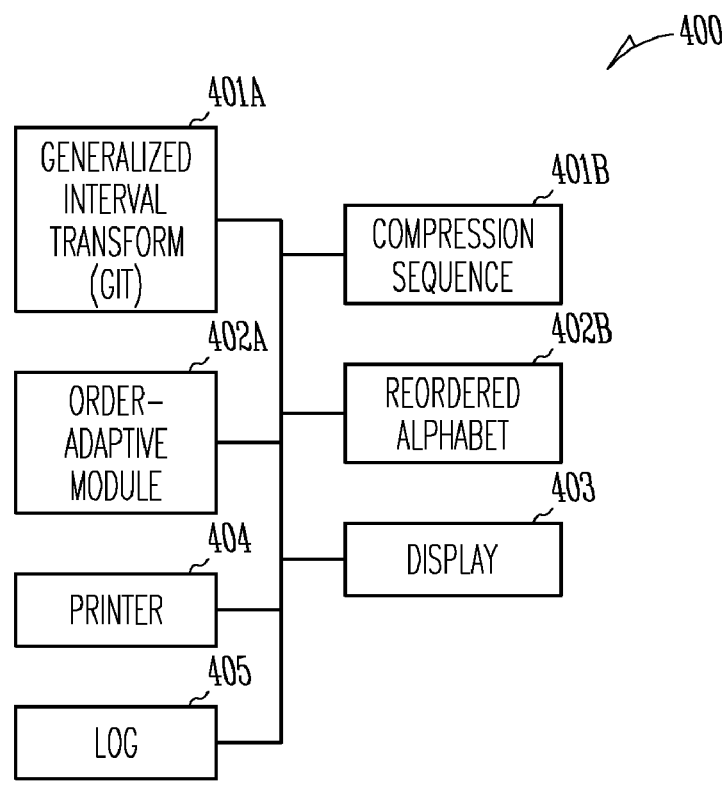
FIG. 4 is a diagram of an order-adaptive compression system, according to an example embodiment.

FIG. 4 is a diagram of an order-adaptive compression system 400, according to an example embodiment. The order-adaptive compression system 400 is implemented in a machine-accessible or readable medium and is optionally accessible over a network. The order-adaptive compression system 400 includes components of the order-adaptive compression apparatus 300 of FIG. 3 and adds one or more additional components.

The order-adaptive compression system 400 includes a GIT module 401A, an order-adaptive module 402A, and a display 403. The GIT module 401A produces a compression sequence 401B, and the order-adaptive module 402A produces an order-adaptive or reordered alphabet 402B for a given compression sequence 401B.

The manners or techniques used by the GIT module 401A and the order-adaptive module 402A were presented above with respect to the order-adaptive compression apparatus 300 of FIG. 3. These techniques are incorporated here with respect to the discussion of the order-adaptive compression system 400 of FIG. 4.

The display 403 provides a mechanism for metadata or data associated with the compression of the string to be presented on the display 403. Thus, compression ratio, pack ratio, time to process a compression, and the like may be presented as data within the display.

The order-adaptive compression system 400 may also include a printer 404. The printer may print the metadata or data associated with the compression of the string on output media.

In an embodiment, the order-adaptive compression system 400 may also include a log 405. The log 405 houses or records metadata or data associated with the compression of the string within memory and/or storage associated with a machine that processes the order-adaptive compression system 400.

The order-adaptive compression system 400 provides additional components that enhance the order adaptive compression apparatus 300 of FIG. 3. These components allow metadata results associated with a compression of a desired string to be viewed on a display 403, printed via a printer 404, and/or stored within a log 405.

The above description is illustrative, and not restrictive. Many other embodiments will be apparent to those of skill in the art upon reviewing the above description. The scope of embodiments of the invention should therefore be determined with reference to the appended claims, along with the full scope of equivalents to which such claims are entitled.

The Abstract is provided to comply with 37 C.F.R. §1.72(b) in order to allow the reader to quickly ascertain the nature and gist of the technical disclosure. It is submitted with the understanding that it will not be used to interpret or limit the scope or meaning of the claims.

In the foregoing description of the embodiments, various features are grouped together in a single embodiment for the purpose of streamlining the disclosure. This method of disclosure is not to be interpreted as reflecting an intention that the claimed embodiments of the invention have more features than are expressly recited in each claim. Rather, as the following claims reflect, inventive subject matter may lie in less than all features of a single disclosed embodiment. Thus the following claims are hereby incorporated into the Description of the Embodiments, with each claim standing on its own as a separate exemplary embodiment.

What is claimed is:

1. A method, comprising:
    iterating a string by matching symbols of the string with elements of an alphabet while ignoring a last element of the alphabet;
    generating, during the iterating, a compression sequence for the string, wherein each sequence entry represents a location in the string for a given symbol relative to other instances of the given symbol within the string; and evaluating, during the generating, a frequency condition for pairs of sequence entries and if the frequency condition is satisfied reordering the alphabet for selective ones of the elements which correspond with the pairs.

2. The method of claim 1 further comprising, initializing the alphabet, wherein the last element of the alphabet is assigned a value of zero.

3. The method of claim 1 further comprising, representing the string as the compression sequence having a recorded alphabet.

4. The method of claim 1, wherein generating further includes subtracting a first value in a first vector of integers from a second value within a second vector of integers to produce a result, wherein the first value represents a number of the symbols that occur within the string before the given symbol and the second value represents an offset number for a prior occurrence within the string for the given symbol, and wherein the result becomes a specific compression sequence entry.

5. The method of claim 4 further comprising, reordering the first and second vectors if the alphabet is reordered.

6. The method of claim 1, wherein evaluating further includes evaluating the frequency condition as a condition that determines number frequencies of first portions of the pairs relative to number frequencies of second portions of the pairs.

7. The method of claim 1, wherein evaluating further includes evaluating the frequency condition as a condition that determines percentage frequencies of first portions of the pairs relative to percentage frequencies of second portions of the pairs.

8. A computer-readable medium having associated instructions implemented thereon, which when processed by a computer, result in a method comprising:

processing a generalized interval transform against an alphabet and a string;

modifying the processing by reordering elements of the alphabet in response to frequency conditions being satisfied; and producing a compression sequence and a reordered alphabet for the string that represents a compression of the string.

9. The medium of claim 8, further including instructions for decompressing the compression sequence with the reordered alphabet to produce the string.

10. The medium of claim 8, further including instructions for ignoring a last element of the alphabet.

11. The medium of claim 8, further including instructions for generating the reordered alphabet in an order that corresponds to frequencies of symbols occurring within the string.

12. The medium of claim 11, further including instructions for generating the order from a highest frequency to a lowest frequency.

13. The medium of claim 11, further including instructions for generating the order from a lowest frequency to a highest frequency.

14. An apparatus, comprising:

a generalized interval transform to produce a compression sequence for a string in response to an alphabet associated with symbols occurring within the string; and an order-adaptive module to modify processing of the generalized interval transform to reorder the alphabet in response to a frequency condition for the symbols occurring within the string, wherein the compression sequence represents positions within the string for a given symbol of the string relative to other instances of the given symbol within the string.

15. An apparatus, comprising:

a generalized interval transform to produce a compression sequence for a string in response to an alphabet associated with symbols occurring within the string; and an order-adaptive module to modify processing of the generalized interval transform to reorder the alphabet in response to a frequency condition for the symbols occurring within the string, wherein the order-adaptive module is to compare pairs of compression sequence entries against the frequency condition and if the frequency condition is satisfied to reorder the alphabet with respect to elements of the alphabet that correspond to the pairs.

* * * * *

UNITED STATES PATENT AND TRADEMARK OFFICE
CERTIFICATE OF CORRECTION

PATENT NO.       : 7,348,899 B2
APPLICATION NO.  : 11/463060
DATED            : March 25, 2008
INVENTOR(S)      : Kravtsounov et al.

It is certified that error appears in the above-identified patent and that said Letters Patent is hereby corrected as shown below:

Title Pg., Item (57), under "Abstract", in column 2, line 2, delete "sting" and insert -- string --, therefor.

In column 7, line 13, in Claim 3, delete "recorded" and insert -- reordered --, therefor.

Signed and Sealed this

First Day of July, 2008

JON W. DUDAS
*Director of the United States Patent and Trademark Office*